(12) United States Patent
Forbes

(10) Patent No.: US 7,528,463 B2
(45) Date of Patent: May 5, 2009

(54) SEMICONDUCTOR ON INSULATOR STRUCTURE

(75) Inventor: Leonard Forbes, Corvallis, OR (US)

(73) Assignee: Micron Technolgy, Inc., Boise, ID (US)

( * ) Notice: Subject to any disclaimer, the term of this patent is extended or adjusted under 35 U.S.C. 154(b) by 582 days.

(21) Appl. No.: 11/214,495

(22) Filed: Aug. 29, 2005

(65) Prior Publication Data

US 2006/0001094 A1    Jan. 5, 2006

Related U.S. Application Data

(62) Division of application No. 10/443,355, filed on May 21, 2003, now Pat. No. 7,008,854.

(51) Int. Cl.
*H01L 29/06*    (2006.01)

(52) U.S. Cl. .............................. 257/618; 257/E27.112; 257/E21.32; 257/E21.545; 257/E21.561; 257/E21.563; 257/E21.564

(58) Field of Classification Search ................ 710/260; 521/61; 428/446; 361/283.4; 257/347, E27.112, 257/E21.32, E21.545, E21.561, E21.563, 257/E21.564, 618
See application file for complete search history.

(56) References Cited

U.S. PATENT DOCUMENTS

| | | | |
|---|---|---|---|
| 3,314,595 A | 4/1967 | Burge | |
| 3,953,839 A | 4/1976 | Dennison et al. | |
| 4,241,359 A | 12/1980 | Izumi et al. | |
| 4,314,595 A | 2/1982 | Yamamoto et al. | |
| 4,322,980 A | 4/1982 | Suzuki et al. | |
| 4,523,975 A | 6/1985 | Groves et al. | |
| 4,589,928 A | 5/1986 | Dalton | |
| 4,631,234 A | 12/1986 | Larrabee | |
| 4,717,681 A | 1/1988 | Curran | |
| 4,962,051 A | 10/1990 | Liaw | |
| 4,996,627 A | * | 2/1991 | Zias et al. ................ 361/283.4 |
| 5,027,101 A | 6/1991 | Morrill, Jr. | |
| 5,063,113 A | * | 11/1991 | Wada .......................... 428/446 |
| 5,098,852 A | 3/1992 | Niki et al. | |

(Continued)

FOREIGN PATENT DOCUMENTS

EP    434984    9/1991

(Continued)

OTHER PUBLICATIONS

"Cornell Demonstrates a Universal Substrate", *Compound Semiconductor*, 3(2), (Mar./Apr. 1997),27-29.

(Continued)

*Primary Examiner*—Davienne Monbleau
*Assistant Examiner*—Monica D Harrison
(74) *Attorney, Agent, or Firm*—Schwegman, Lundberg & Woessner, P.A.

(57) ABSTRACT

An apparatus and a method for forming the apparatus include a semiconductor layer on an insulating substrate, where the substrate is a different material than the semiconductor layer, and has a coefficient of thermal expansion substantially equal to that of the semiconductor layer. The semiconductor layer can also be formed having a thickness such that it does not yield due to temperature-induced strain at device processing temperatures. A silicon layer bonded to a silicon oxycarbide glass substrate provides a silicon on insulator wafer in which circuitry for electronic devices is fabricated.

40 Claims, 6 Drawing Sheets

U.S. PATENT DOCUMENTS

| | | |
|---|---|---|
| 5,234,535 A | 8/1993 | Beyer et al. |
| 5,343,064 A | 8/1994 | Spangler et al. |
| 5,426,061 A | 6/1995 | Sopori |
| 5,441,591 A | 8/1995 | Imthurn et al. |
| 5,443,661 A | 8/1995 | Oguro et al. |
| 5,461,243 A | 10/1995 | Ek et al. |
| 5,471,180 A | 11/1995 | Brommer et al. |
| 5,482,869 A | 1/1996 | Kohyama |
| 5,487,999 A | 1/1996 | Farnworth |
| 5,526,449 A | 6/1996 | Meade et al. |
| 5,646,053 A | 7/1997 | Schepis |
| 5,656,886 A | 8/1997 | Westphal et al. |
| 5,661,044 A | 8/1997 | Holland et al. |
| 5,673,223 A | 9/1997 | Park |
| 5,679,475 A | 10/1997 | Yamagata et al. |
| 5,684,997 A * | 11/1997 | Kau et al. .................... 710/260 |
| 5,691,230 A | 11/1997 | Forbes |
| 5,735,949 A | 4/1998 | Mantl et al. |
| 5,739,796 A | 4/1998 | Jasper et al. |
| 5,759,898 A | 6/1998 | Ek et al. |
| 5,773,152 A | 6/1998 | Okonogi |
| 5,789,859 A | 8/1998 | Watkins et al. |
| 5,840,590 A | 11/1998 | Myers, Jr. et al. |
| 5,854,501 A | 12/1998 | Kao |
| 5,858,819 A | 1/1999 | Miyasaka |
| 5,877,070 A | 3/1999 | Goesele et al. |
| 5,879,996 A | 3/1999 | Forbes |
| 5,900,652 A | 5/1999 | Battaglia et al. |
| 5,926,740 A | 7/1999 | Forbes et al. |
| 5,949,102 A | 9/1999 | Saida et al. |
| 5,963,817 A | 10/1999 | Chu et al. |
| 5,987,200 A | 11/1999 | Fleming et al. |
| 5,991,225 A | 11/1999 | Forbes et al. |
| 5,997,378 A | 12/1999 | Dynka et al. |
| 5,999,308 A | 12/1999 | Nelson et al. |
| 6,001,711 A | 12/1999 | Hashimoto |
| 6,022,793 A | 2/2000 | Wijaranakula et al. |
| 6,028,436 A | 2/2000 | Akram et al. |
| 6,049,106 A | 4/2000 | Forbes |
| 6,054,808 A | 4/2000 | Watkins et al. |
| 6,075,640 A | 6/2000 | Nelson |
| 6,077,792 A | 6/2000 | Farrar |
| 6,083,324 A | 7/2000 | Henley et al. |
| 6,093,623 A | 7/2000 | Forbes |
| 6,093,624 A | 7/2000 | Letavic et al. |
| 6,096,433 A | 8/2000 | Kikuchi et al. |
| 6,103,598 A | 8/2000 | Yamagata et al. |
| 6,107,661 A | 8/2000 | Okabe et al. |
| 6,110,793 A | 8/2000 | Lee et al. |
| 6,127,777 A | 10/2000 | Watkins et al. |
| 6,136,666 A | 10/2000 | So |
| 6,139,626 A | 10/2000 | Norris et al. |
| 6,143,628 A | 11/2000 | Sato et al. |
| 6,162,657 A | 12/2000 | Schiele et al. |
| 6,172,456 B1 | 1/2001 | Cathey et al. |
| 6,174,784 B1 | 1/2001 | Forbes |
| 6,175,242 B1 | 1/2001 | Akram et al. |
| 6,180,487 B1 | 1/2001 | Lin |
| 6,204,145 B1 | 3/2001 | Noble |
| 6,228,694 B1 | 5/2001 | Doyle et al. |
| 6,242,324 B1 | 6/2001 | Kub et al. |
| 6,251,751 B1 | 6/2001 | Chu et al. |
| 6,261,876 B1 | 7/2001 | Crowder et al. |
| 6,271,273 B1 * | 8/2001 | You et al. .................... 521/61 |
| 6,274,457 B1 | 8/2001 | Sakai et al. |
| 6,274,460 B1 | 8/2001 | Delgado et al. |
| 6,309,907 B1 | 10/2001 | Forbes et al. |
| 6,309,950 B1 | 10/2001 | Forbes |
| 6,315,826 B1 | 11/2001 | Muramatsu |
| 6,328,620 B1 | 12/2001 | Hu |
| 6,328,796 B1 | 12/2001 | Kub et al. |
| 6,337,260 B1 | 1/2002 | Ishida |
| 6,338,805 B1 | 1/2002 | Anderson |
| 6,339,011 B1 | 1/2002 | Gonzalez et al. |
| 6,351,028 B1 | 2/2002 | Akram |
| 6,368,938 B1 | 4/2002 | Usenko |
| 6,376,336 B1 | 4/2002 | Buynoski |
| 6,377,070 B1 | 4/2002 | Forbes |
| 6,383,924 B1 | 5/2002 | Farrar et al. |
| 6,387,732 B1 | 5/2002 | Akram |
| 6,391,738 B2 | 5/2002 | Moore |
| 6,392,430 B1 | 5/2002 | Akram et al. |
| 6,413,827 B2 | 7/2002 | Farrar |
| 6,423,613 B1 | 7/2002 | Geusic |
| 6,424,001 B1 | 7/2002 | Forbes et al. |
| 6,436,187 B1 | 8/2002 | Patel et al. |
| 6,444,534 B1 | 9/2002 | Maszara |
| 6,448,157 B1 | 9/2002 | Okonogi |
| 6,448,601 B1 | 9/2002 | Forbes et al. |
| 6,451,672 B1 | 9/2002 | Caruso et al. |
| 6,452,713 B1 | 9/2002 | White |
| 6,455,397 B1 | 9/2002 | Belford |
| 6,461,933 B2 | 10/2002 | Houston |
| 6,465,873 B1 | 10/2002 | Gonzalez |
| 6,469,532 B2 | 10/2002 | Akram et al. |
| 6,476,434 B1 | 11/2002 | Noble et al. |
| 6,478,883 B1 | 11/2002 | Tamatsuka et al. |
| 6,486,008 B1 | 11/2002 | Lee |
| 6,489,183 B1 | 12/2002 | Farnworth |
| 6,496,034 B2 | 12/2002 | Forbes et al. |
| 6,497,763 B2 | 12/2002 | Kub et al. |
| 6,514,836 B2 | 2/2003 | Belford |
| 6,515,335 B1 | 2/2003 | Christiansen et al. |
| 6,531,727 B2 | 3/2003 | Forbes et al. |
| 6,537,856 B2 | 3/2003 | Akram |
| 6,538,330 B1 | 3/2003 | Forbes |
| 6,541,356 B2 | 4/2003 | Fogel et al. |
| 6,542,682 B2 | 4/2003 | Cotteverte et al. |
| 6,559,491 B2 | 5/2003 | Forbes et al. |
| 6,566,682 B2 | 5/2003 | Forbes |
| 6,576,993 B2 | 6/2003 | Akram |
| 6,579,738 B2 | 6/2003 | Farrar et al. |
| 6,582,512 B2 | 6/2003 | Geusic et al. |
| 6,583,052 B2 | 6/2003 | Shin |
| 6,583,437 B2 | 6/2003 | Mizuno et al. |
| 6,593,625 B2 | 7/2003 | Christiansen et al. |
| 6,597,203 B2 | 7/2003 | Forbes |
| 6,620,683 B1 | 9/2003 | Lin et al. |
| 6,624,006 B2 | 9/2003 | Akram |
| 6,630,713 B2 | 10/2003 | Geusic |
| 6,642,123 B2 | 11/2003 | Mun et al. |
| 6,646,458 B2 | 11/2003 | Akram et al. |
| 6,649,476 B2 | 11/2003 | Forbes |
| 6,649,480 B2 | 11/2003 | Fitzgerald et al. |
| 6,649,492 B2 | 11/2003 | Chu et al. |
| 6,656,782 B2 | 12/2003 | Skotnicki et al. |
| 6,656,822 B2 | 12/2003 | Doyle et al. |
| 6,689,671 B1 | 2/2004 | Yu et al. |
| 6,703,293 B2 | 3/2004 | Tweet et al. |
| 6,703,648 B1 | 3/2004 | Xiang et al. |
| 6,717,216 B1 | 4/2004 | Doris et al. |
| 6,740,913 B2 | 5/2004 | Doyle et al. |
| 6,809,016 B1 | 10/2004 | Xiang |
| 6,812,508 B2 | 11/2004 | Fukumi |
| 6,855,649 B2 | 2/2005 | Christiansen et al. |
| 6,900,094 B2 | 5/2005 | Hammond et al. |
| 6,902,616 B1 | 6/2005 | Yamazaki et al. |
| 6,929,984 B2 | 8/2005 | Forbes et al. |
| 6,963,078 B2 | 11/2005 | Chu |
| 6,987,037 B2 | 1/2006 | Forbes |
| 6,994,762 B2 | 2/2006 | Clingman et al. |
| 7,008,854 B2 | 3/2006 | Forbes |
| 7,023,051 B2 | 4/2006 | Forbes |
| 7,041,575 B2 | 5/2006 | Forbes |

| | | |
|---|---|---|
| 7,045,874 B2 | 5/2006 | Forbes |
| 7,084,429 B2 | 8/2006 | Forbes |
| 7,115,480 B2 | 10/2006 | Forbes |
| 7,153,753 B2 | 12/2006 | Forbes |
| 7,198,974 B2 | 4/2007 | Forbes |
| 7,202,530 B2 | 4/2007 | Forbes |
| 7,220,656 B2 | 5/2007 | Forbes |
| 7,262,428 B2 | 8/2007 | Forbes |
| 7,271,445 B2 | 9/2007 | Forbes |
| 7,273,788 B2 | 9/2007 | Forbes |
| 7,326,597 B2 | 2/2008 | Forbes et al. |
| 7,368,790 B2 | 5/2008 | Forbes |
| 7,394,111 B2 | 7/2008 | Forbes |
| 2001/0052621 A1 | 12/2001 | Beaman |
| 2002/0001965 A1 | 1/2002 | Forbes |
| 2002/0048968 A1 | 4/2002 | Ahn |
| 2002/0062782 A1 | 5/2002 | Norris et al. |
| 2002/0070419 A1 | 6/2002 | Farrar et al. |
| 2002/0070421 A1 | 6/2002 | Ashburn |
| 2002/0076896 A1 | 6/2002 | Farrar et al. |
| 2002/0079557 A1 | 6/2002 | Ahn et al. |
| 2002/0125471 A1 | 9/2002 | Fitzgerald et al. |
| 2002/0135020 A1 | 9/2002 | Skotnicki et al. |
| 2002/0158322 A1 | 10/2002 | Farrar |
| 2002/0163044 A1 | 11/2002 | Farrar |
| 2002/0163045 A1 | 11/2002 | Farrar |
| 2002/0164859 A1 | 11/2002 | Farrar |
| 2002/0175330 A1 | 11/2002 | Geusic |
| 2002/0185686 A1 | 12/2002 | Christiansen et al. |
| 2003/0013323 A1 | 1/2003 | Hammond et al. |
| 2003/0027406 A1 | 2/2003 | Malone |
| 2003/0042627 A1 | 3/2003 | Farrar et al. |
| 2003/0131782 A1 | 7/2003 | Geusic et al. |
| 2003/0133683 A1 | 7/2003 | Forbes |
| 2003/0157780 A1 | 8/2003 | Farrar et al. |
| 2003/0190796 A1 | 10/2003 | Geusic |
| 2003/0193088 A1 | 10/2003 | Hall |
| 2003/0197234 A1 | 10/2003 | Farrar |
| 2003/0201468 A1 | 10/2003 | Christiansen et al. |
| 2003/0218189 A1 | 11/2003 | Christiansen et al. |
| 2003/0227072 A1 | 12/2003 | Forbes et al. |
| 2004/0048450 A1 | 3/2004 | Tweet et al. |
| 2004/0171196 A1 | 9/2004 | Walitzki |
| 2004/0173798 A1 | 9/2004 | Forbes |
| 2004/0214366 A1 | 10/2004 | Segal et al. |
| 2004/0217352 A1 | 11/2004 | Forbes |
| 2004/0217391 A1 | 11/2004 | Forbes |
| 2004/0224480 A1 | 11/2004 | Forbes |
| 2004/0232422 A1 | 11/2004 | Forbes |
| 2004/0232487 A1 | 11/2004 | Forbes |
| 2004/0232488 A1 | 11/2004 | Forbes |
| 2004/0235264 A1 | 11/2004 | Forbes |
| 2005/0017273 A1 | 1/2005 | Forbes et al. |
| 2005/0020094 A1 | 1/2005 | Forbes et al. |
| 2005/0023529 A1 | 2/2005 | Forbes |
| 2005/0023612 A1 | 2/2005 | Forbes |
| 2005/0023616 A1 | 2/2005 | Forbes |
| 2005/0029619 A1 | 2/2005 | Forbes |
| 2005/0029683 A1 | 2/2005 | Forbes et al. |
| 2005/0032296 A1 | 2/2005 | Forbes |
| 2005/0087842 A1 | 4/2005 | Forbes |
| 2005/0250274 A1 | 11/2005 | Forbes et al. |
| 2005/0285139 A1 | 12/2005 | Forbes |
| 2006/0011982 A1 | 1/2006 | Forbes |
| 2006/0097281 A1 | 5/2006 | Forbes |
| 2006/0208343 A1 | 9/2006 | Forbes |
| 2006/0244105 A1 | 11/2006 | Forbes et al. |
| 2006/0258063 A1 | 11/2006 | Forbes |
| 2006/0258123 A1 | 11/2006 | Forbes |
| 2006/0263994 A1 | 11/2006 | Forbes |
| 2006/0267152 A1 | 11/2006 | Forbes |
| 2007/0096193 A1 | 5/2007 | Forbes |

FOREIGN PATENT DOCUMENTS

| | | |
|---|---|---|
| EP | 1030196 | 8/2000 |
| EP | 1085352 | 3/2001 |
| JP | 54-152464 A | 11/1979 |
| JP | 54-155770 A | 12/1979 |
| JP | 04-304653 | 10/1992 |
| JP | 2001-093887 | 4/2001 |
| WO | WO-98/35248 | 8/1998 |
| WO | WO02097982 | 12/2002 |

OTHER PUBLICATIONS

Abe, T , "Silicon Wafer-Bonding Process Technology for SOI Structures", *Extended Abstracts of the 22nd (1990 International) Conference on Solid State Devices and Materials*, (1990),853-856.

Auberton-Herve, A J., "SOI: Materials to Systems", *International Electron Devices Meeting. Technical Digest*, (1996),3-10.

Auberton-Herve, A. J., "SOI: Materials to Systems", *Digest of the International Electron Device Meeting*, San Francisco,(Dec. 1996),3-10.

Autumn, Kellar, et al., "Adhesive force of a single gecko foot-hair", *Nature*, 405(6787), (Jun. 2000),681-685.

Autumn, Kellar, et al., "Evidence for van der Waals adhesion in gecko setae.", *Proceedings of the National Academy of Science U S A.*; 99(19), (Sep. 17, 2002),12252-6.

Baginski, T. A., "Back-side germanium ion implantation getterring of silicon", *Journal of the Electrochemical Society*, 135(7), Dept of Electrical Engineering, Auburn Univ, AL,(Jul. 1988),1842-3.

Ball, Philip , "Why microchips weigh over a kilogram: A small mountain of materials goes into every microchip", *Nature Science Update*, http://www.nature.com/nsu/021028/021028-12.html,(Nov. 2, 2002),1-2.

Banhart, John, "Manufacture, characterisation and application of cellular metals and metal foams", *Progress in Materials Science*, vol. 46, Issue 6, (2001),559-632.

Banhart, John, "On the road again: metal foams find favor", *Physics Today*, 55(7), (Jul. 2002),37-42.

Belford, Rona E., et al., "Performance-Augmented CMOS Using Back-End Uniaxial Strain", *IEEE 60th DRC. Conference Digest Device Research Conference*, 2002, (Jun. 24-26, 2002),41-42.

Berti, M., "Composition and Structure of Si-Ge Layers Produced by Ion Implantation and Laser Melting", *Journal of Materials Research*, 6(10), (Oct. 1991),2120-2126.

Berti, M., "Laser Induced Epitaxial Regrowth of Si[sub 1-x]Ge[sub x]/Si Layers Produced by Ge Ion Implantation", *Applied Surface Science*, 43, (1989),158-164.

Bialas, F., et al., "Intrinsic Gettering of 300 mm CZ Wafers", *Microelectronic Engineering*, 56(1-2), (May 2001),15 7-63.

Biever, Celeste, "Secret of 'strained silicon' revealed: behind closed doors, Intel has perfected a novel way to improve chip performance.", *New Scientist*, 180(i2426-2428), (Dec. 20, 2003),27.

Binns, M. J., et al., "The Realization of Uniform and Reliable Intrinsic Gettering in 200mm P- & P/P Wafers for a Low Thermal Budget 0.18 mu m Advanced CMOS Logic Process", *Diffusion and Defect Data Pt.B: Solid State Phenomena*, 82-84, (2001),387-92.

Birner, A , "Macroporous silicon: a two-dimensional photonic bandgap material suitable for the near-infrared spectral range", *Physica Status Solidi A*; 165, (Jan. 16, 1998),111-117.

Birner, A., "Silicon-Based Photonic Crystals", *Advanced Materials*, 13(6), (Mar. 2001),377-388.

Blanco, A, "Large-scale synthesis of a silicon photonic crystal with a complete three-dimensional bandgap near 1.5 micrometres", *Nature*, 405(6785), (May 25, 2000),437-40.

Blanford, C F., "Gems of Chemistry and Physics: Macroporous Metal Oxides with 3D Order", *Advanced Materials*, 13(6), (Mar. 2001).

Bronner, G. B., et al., "Physical Modeling of Backside Gettering", *Impurity Diffusion and Gettering in Silicon Symposium*, Sponsor: Mater. Res. Soc, Nov. 1984, Boston, MA, (1985),27-30.

Brown, Chappell , "Bonding twist hints at universal substrate", *EETimes*, (1997),2 pages.

Bruel, M , "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997),1636-1641.

Cartagena, E , "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ, (1993),1199-1200.

Chen, Xiangdong, et al., "Vertical P-MOSFETs with heterojunction between source/drain and channel", *IEEE Device Research Conference*, (2000),25-26.

Chilton, B T., et al., "Solid phase epitaxial regrowth of strained Si(1-x)Ge(x)/Si strained layer structures amorphized by ion implantation", *Applied Physics Letters*, 54(1), (Jan. 2, 1989),42-44.

Choe, K. S., et al., "Minority-Carrier Lifetime Optimization in Silicon MOS Devices by Intrinsic Gettering", *Journal of Crystal Growth*, 218(2-4), (Sep. 2000),239-44.

Clark, Don , et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96. Proceedings of the 26th European Solid State Device Research Conference*, (Sep. 1996),519-22.

Dharmatilleke, S N., et al., "Anodic Bonding of Glass to Glass and Silicon to Glass or Silicon to Silicon Through a Very Thick Thermally Grown SiO2 Layer", *Proceedings of IS 3M International Symposium on Smart Structures and Microsystems*, http://dolphin.eng.uc.edu/projects/bonding/paper.pdf,(2002),32.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998),13-17.

Edrington, A C., "Polymer-Based Photonic Crystals", *Advanced Materials*, 13(6), (Mar. 2001),421-425.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Fournel, F, et al., "Ultra High Precision Of The Tilt/Twist Misorientation Angles In Silicon/Silicon Direct Wafer Bonding ", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Godbole, H. , et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989),201-3.

Gong, S. S., et al., "Implantation Gettering in Silicon", *Solid-State Electronics*, 30(2), (Feb. 1987),209-211.

Graf, D. , et al., "300 mm epi pp- wafer: is there sufficient gettering?", *High Purity Silicon VI. Proceedings of the Sixth International Symposium (Electrochemical Society Proceedings vol. 2000-17)* (*SPIE vol. 4218*), (2000),319-30.

Haddad, H. , et al., "Carbon Doping Effects on Hot Electron Trapping", *28th Annual Proceedings. Reliability Physics 1990*, (Mar. 1990),288-9.

Haddad, H. , et al., "Electrical Activity of Bulk Stacking Faults in Silicon", *Materials Letters*, 7(3), Hewlett-Packard Northwest Integrated Circuits Div, Corvallis OR,(Sep. 1988),99-101.

Harendt, Christine , "Silicon on Insulator Material by Wafer Bonding", *Journal of Electronic Materials*, 20(3), (Mar. 1991),267-77.

Ho, K , "Existence of a photonic gap in periodic dielectric structures", *Physical Review Letters*, 65(25), (Dec. 17, 1990),3152-3155.

Holland, Brian T., " Synthesis of Macroporous Mineral with Highly Ordered Three-Dimensional Arrays of Spheroidal Voids", *Science*, 281, (Jul. 24, 1998),538-540.

Imthurn, George P., et al., "Bonded Silicon-on-Sapphire Wafers and Devices", *Journal of Applied Physics*, 72(6), (Sep. 1992),2526-7.

Iyer, S S., "Separation by Plasma Implantation of Oxygen (SPIMOX) operational phase space", *IEEE trans. on Plasma Science*, 25, (1997),1128-1135.

Jiang, P , "The Fabrication and Bandgap Engineering of Photonic Multilayers", *Advanced Materials*, 13(6), (Mar. 2001),389-393.

Joannopoulos, J D., "Photonic crystals : molding the flow of light", *Princeton, N.J. : Princeton University Press*, (1995),6.

John, S, "Photonic bandgap formation and tunability in certain self-organizing systems", *Journal of Lightwave Technology*, 17(11), (Nov. 1999), 1931-1943.

Johnson, S G., "Guided modes in photonic crystal slabs", *Physical Review B (Condensed Matter)*, 60(8), (Aug. 15, 1999),5751-8.

Jurczak, M , "SON (silicon on nothing)-a new device architecture for the ULSI era", *VLSI Technology, 1999. Digest of Technical Papers. 1999 Symposium on , Jun. 14-16, 1999*, (Jun. 1999),29-30.

Kalavade, Pranav , et al., "A novel sub-10 nm transistor", *58th DRC. Device Research Conference. Conference Digest*, (Jun. 19-21, 2000),71-72.

Kang, J. S., et al., "Gettering in Silicon", *Journal of Applied Physics*, 65(8), Center for Solid State Electron Res., Arizona State Univ., Tempe, AZ,(Apr. 15, 1989),2974-85.

Kostrzewa, M , et al., "Testing the Feasibility of strain relaxed InAsP and InGaAs compliant substrates", *EMC 2003 International Conference Indium Phosphide and Related Materials. Conference Proceedings*, (Jun. 2003),8.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA,(Dec. 1983),1437-41.

Lasky, J. B., "Wafer Bonding for Silicon-on-Insulator Technologies", *Applied Physics Letters*, 48(1), (Jan. 6, 1986),78-80.

Li, Y. X., et al., "New intrinsic gettering process in Czochralski-silicon wafer", *6th International Conference on Solid-State and Integrated Circuit Technology. Proceedings*, 1(1), (2001),277-9.

Li, Z Y., "Photonic Bandgaps in Disordered Inverse-Opal Photonic Crystals", *Advanced Materials*, 13(6), (Mar. 2001),433-436.

Lin, Shawn Yu, "A three-dimensional optical photonic crystal", *Journal of Lightwave Technology*, 17(11), (Nov. 1999),1944-1947.

Loncar, M , "Waveguiding in planar photonic crystals", *Applied Physics Letters*, 77(13), (Sep. 25, 2000), 1937-1939.

Loo, Y L., et al., "Contact Printing With Nanometer Resolution", *Device Research Conference*, (Jun. 2002), 149-150.

Lu, D, , "Bonding Silicon Wafers by Use of Electrostatic Fields Followed by Rapid Thermal Heating", *Materials Letters*, 4(11), (Oct. 1986),461-464.

Lu, Y , "Three-Dimensional Photonic Crystals with Non-spherical Colloids as Building Blocks", *Advanced Materials*, 13(6), (Mar. 2001),415-420.

Manoharan, V N., "Photonic Crystals from Emulsion Templates", *Advanced Materials*, 13(6), (Mar. 2001),447-450.

Miguez, H , "Synthesis and Photonic Bandgap Characterization of Polymer Inverse Opals", *Advanced Materials*, 13(6), (Mar. 2001),393-396.

Mitsutake, K , "Theoretical Study on the Formation Process of Empty Space in Silicon (ESS)", *2000 International Conference on Solid State Devices and Materials*, (2000), 198-199.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.

Mizushima, I. , "Empty-space-in-silicon technique for fabricating a silicon-on-nothing structure", *Applied Physics Letters*, 77(20), American Institute of Physics, NY,(Nov. 13, 2000),3290-3292.

Moran, Peter , "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,(Jun. 2002),pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),28-32.

Nayak, D.K. , "High performance GeSi quantum-well PMOS on SIMOX", *International Electron Devices Meeting 1992. Technical Digest*, (1992),777-80.

Ni, P , "Synthetic SiO2 Opals", *Advanced Materials*, 13(6), (Mar. 2001),437-441.

Nicholas, F. A., et al., "Surface- (interface-) and volume-diffusion contributions to morphological changes driven by capillarity", *Trans-* actions of the American Institute of Mining, Metallurgical and Petroleum Engineers, 233(10), (1965),1840-8.

Norris, D J., "Chemical Approaches to Three-Dimensional Semiconductor Photonic Crystals", *Advanced Materials*, 13(6), (Mar. 2001),371-376.

O'Neill, A G., et al., "High speed deep sub-micron MOSFET using high mobility strained silicon channel", *ESSDERC '95. Proceedings of the 25th European Solid State Device Research Conference*, (Sep. 1995),109-12.

Omi, Hiroo, et al., "Semiconductor Surface with Strain Control", http://www.brl.ntt.co.jp/J/kouhou/katsudou/report00/E/report04_e.html.

Or, B S., et al., "Annealing effects of carbon in n-channel LDD MOSFETs", *IEEE Electron Device Letters*, 12(11), Dept of Electrical & Computing Engr, Oregon State Univ, Corvallis OR,(Nov. 1991),596-8.

Ouyang, Q , et al., "Bandgap Engineering in Deep Submicron Vertical pMOSFETs", *IEEE 58th DRC. Device Research Conference. Conference Digest*, (2000),27-28.

Paine, D. C., et al., "The Growth of Strained Si]-xGex Alloys on (100) Silicon Using Solid Phase Epitaxy", *Journal of Materials Research*, 5(5), (May 1990),1023-1031.

People, R. , "Calculation of critical layer thickness versus lattice mismatch for GexSi1-x/Si strained-layer heterostructures", *Applied Physics Letters*, 47(3), (Aug. 1, 1985),322-4.

Reinhold Publishing Co., "Comparisons of Materials: Coefficient of Thermal Expansion", *Reprinted with permission from "Materials Selector"*, Reinhold Publishing Co., Penton/IPC, http://www.handyharmancanada.com/The BrazingBook/comparis.htm.

Renlund, G. , "Silicon oxycarbide glasses: Part II. Structure and properties", *Journal of Materials Research*, 6(12), (Dec. 1991),2723-2734.

Rim, Kern , et al., "Fabrication and analysis of deep submicron strained-Si n-MOSFET's", *IEEE Transactions on Electron Devices*, 47(7), (Jul. 2000),1406-1415.

Rim, Kern , et al., "Strained Si NMOSFETs for High Performance CMOS Technology", *2001 Symposium on VLSI Technology. Digest of Technical Papers*, (2001),59-60.

Rim, Kern , et al., "Transconductance enhancement in deep submicron strained Si n-MOSFETs", *International Electron Devices Meeting 1998. Technical Digest*, (1998),707-710.

Rubin, L , et al., "Effective gettering of oxygen by high dose, high energy boron buried layers", *1998 International Conference on Ion Implantation Technology. Proceedings*, 2(2), (1998),1010-13.

Sato, Tsutomu , "A New Substrate Engineering for the Formation of Empty Space in Silicon (ESS) Induced by Silicon Surface Migration", *IEDM Digest, paper 20.6.1*, (1999),20.6.1-20.6.4.

Sato, T , "Trench transformation technology using hydrogen annealing for realizing highly reliable device structure with thin dielectric films", *1998 Symposium on VLSI Technology Digest of Technical Papers*, (1998),206-7.

Smith, C J., "Low-loss channel waveguides with two-dimensional photonic crystal boundaries", *Applied Physics Letters*, 77(18), (Oct. 30, 2000),2813-2815.

Subramania, G , *Advanced Materials*, 13(6), Inverse Face-Centered Cubic Thin Film Photonic Crystals,(Mar. 2001),443-446.

Sugiyama, N , et al., "Formation of strained-silicon layer on thin relaxed-SiGe/SiO/sub 2//Si structure using SIMOX technology", *Thin Solid Films*, 369(1-2), (Jul. 2000),199-202.

Suni, T , et al., "Effects of Plasma Activation on Hydrophilic Bonding of Si and SiO2", *Journal of the Electrochemical Society*, 149, (2002),G348-51.

Suyal, N , et al., "A solid state 29Si and 13C NMR study on the synthesis of thin silicon-oxycarbide glass sheets by a sol-gel route", *Journal of Materials Chemistry*, 9(12), (1999),3061-3067.

Suyal, N , et al., "Microstructural and Dielectric Characterization of Sol-Gel Derived Silicon Oxycarbide Glass Sheets", *Journal of Sol-Gel Science and Technology*, 14 (1), (1999),113-123.

Suyal, N , et al., "Sol-gel synthesis & microstructural characterization of silicon oxycarbide glass sheets with high fracture strength and high modulus", *Journal of Sol-Gel Science & Technology*, (1998),995-999.

Sze, S. M., "Physics of Semiconductor Devices", *New York, Wiley-Interscience*, ISBN: 0471842907,(1969),402-407.

Takagi, Shin-Ichi , "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002),37-40.

Tan, T. Y., et al., "Intrinsic Gettering by Oxide Precipitate Induced Dislocations in Czochralski Silicon", *Applied Physics Letters*, vol. 30, No. 4, (Feb. 1977),175-176.

Tessier, P M., "Structured Metallic Films for Optical and Spectroscopic Applications via Colloidal Crystal Templating", *Advanced Materials*, 13(6), (Mar. 2001),396-400.

Verdonckt-Vandebroek,, Sophie , et al., "SiGe-Channel Heterojunction p-MOSFET's", *IEEE Transactions on Electron Devices*, 41(1), (Jan. 1994),90-101.

Welser, J , et al., "Strain dependence of the performance enhancement in strained-Si n-MOSFETs", *IEEE International Electron Devices Meeting 1994. Technical Digest*, (Dec. 11-14, 1994),373-376.

Whitwer, F. D., et al., "DLTS characterization of precipitation induced microdefects", *Materials Issues in Silicon Integrated Circuit Processing Symposium*, (Apr. 1986),53-57.

Wijaranakula, W. , et al., "Effect of Pre- and Postepitaxial Deposition Annealing on Oxygen Precipitation in Silicon", *Journal of Materials Research*, 1(5), Dept of Electr & Comput Eng, Oregon State Univ, Corvallis, OR,(Sep.-Oct. 1986),698-704.

Wijaranakula, W. , et al., "Effect of preanneal heat treatment on oxygen precipitation in epitaxial silicon", *Materials Issues in Silicon Integrated Circuit Processing Symposium*, (Apr. 1986),139-44.

Wijaranakula, W. , et al., "Internal Gettering Heat Treatments and Oxygen Precipitation in Epitaxial Silicon Wafers", *Journal of Materials Research*, 1(5), Dept of Electr & Comput. Eng, Oregon State Univ., Corvallis, OR,(Sep.-Oct. 1986),693-7.

Wijaranakula, W. , et al., "Oxygen precipitation in p/p+(100) epitaxial silicon material", *Journal of the Electrochemcial Society*, 134(9), SEH America, Inc., Mater. Characterization Lab., Vancouver, WA,(Sep. 1987),2310-16.

Wild, M. , "Laser Assisted Bonding of Silicon and Glass in Micro-System Technology", http://www.ilt.fhg.de/eng/jb00-s42.html, Fraunhofer ILT - jb00-s42,(2003),1.

Xia, Y , "Photonic Crystals", *Advanced Materials*, 13(6), (Mar. 2001), 369.

Xia, Y , "Self-Assembly Approaches to Three-Dimensional Photonic Crystals", *Advanced Materials*, 13(6), (Mar. 2001),409-413.

Xuan, Peiqi , et al., "60nm Planarized Ultra-thin Body Solid Phase Epitaxy MOSFETs", *IEEE Device Research Conference, Conference Digest. 58th DRC*, (Jun. 19-21, 2000),67-68.

Yablonovitch, E , "Inhibited spontaneous emission in solid-state physics and electronics", *Physical Review Letters*, 58(20), (May 18, 1987),2059-62.

Yablonovitch, E , "Photonic band structure: the face-centered-cubic case employing nonspherical atoms", *Physical Review Letters*, 67(17), (Oct. 21, 1991),2295-8.

Yang, D. , et al., "Intrinsic Gettering in Nitrogen Doped Czochralski Crystal Silicon", *High Purity Silicon VI. Proceedings of the Sixth International Symposium (Electrochemical Society Proceedings* vol. 2000-17) (*SPIE* vol. 4218), (2000),357-61.

Yang, Deren , et al., "Nitrogen in Czochralski Silicon", *2001 6th International Conference on Solid-State and Integrated Circuit Technology. Proceedings*, 1(1), (2001),255-60.

Yang, P , "Patterning Porous Oxides within Microchannel Networks", *Advanced Materials*, 13(6), (Mar. 2001),427-431.

Yin, Haizhou , "High Ge-Content Relaxed Si1-xGex Layers by Relaxation on Compliant Substrate with Controlled Oxidation", *Electronic Materials Conference*, Santa Barbara, Jun. 2002, (Jun. 2002),8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic devices and materials", *IEEE Journal of Selected Topics in Quantum Electronics*, (Jun. 1997),927-936.

Brequel, H, "Structural chacterization and crystallization behaviour of silicon oxycarbide glasses", *XIX International Congress on Glass*, Proceedings of the Congress held at the Edinburgh International Conference Centre, Scotland, Jul. 1-6, 2001. Contains invited papers volume and extended abstracts of all the papers and posters presented during the Congress., (2001).

Kal, S., et al., "Strained Silicon-SiGe Devices Using Germanium Implantation", *IETE Journal of Research*, 43 (2-3), (Mar. 1997), 185-192.

Lu, X., et al., "SiGe and SiGeC Surface Alloy Formation Using High-Dose Implantation and Solid Phase Epitaxy", *Proceedings of the 11th International Conference on Ion Implantation Technology*, Austin, TX, (1997), 686-689.

Verdonckt-Vandebroek, S., et al., "SiGe-Channel Heterojunction p-MOSFET's", *IEEE Transactions on Electron Devices*, 41(1), (Jan. 1994), 90-101.

Wolf, S., et al., "Silicon Processing For The VLSI ERA", *Lattice Press*, 1 (1986), 280-286.

\* cited by examiner

SEMICONDUCTOR ON INSULATOR STRUCTURE

CROSS REFERENCE TO RELATED APPLICATIONS

The present application is a divisional of U.S. application Ser. No. 10/443,355, filed May 21, 2003, now U.S. Pat. No. 7,008,854, which is herein incorporated by reference in its entirety.

This application is related to the following commonly assigned U.S. patent application, U.S. application Ser. No. 10/443,340, entitled: "Ultra-Thin Semiconductors Bonded on Substrates," filed May 21, 2003, now U.S. Pat. No. 7,273,788, which is herein incorporated by reference in its entirety.

TECHNICAL FIELD

This application relates generally to electronic devices and device fabrication and, in particular, semiconductor on insulator devices and their fabrication.

BACKGROUND

Almost half the energy expended by a silicon microchip during its manufacture and lifetime is spent in producing the silicon wafer material, and another quarter is spent during the operating lifetime of the microchip. A technique that reduces the energy associated with fabrication of the silicon material and power consumption during operation will reduce the overall cost of the silicon microchip integrated circuit.

Power consumption during operation can be reduced using silicon on insulator (SOI) technology. The use of SOI technology not only results in a lower power consumption but also increased speed of operation of integrated circuits due to a reduction in stray capacitance. For SOI structures, thin layers of silicon on insulator can be fabricated using several well known techniques such as separation by implantation of oxygen (SIMOX), separation by plasma implantation of oxygen (SPIMOX), silicon on sapphire (SOS), bonded wafer processes on silicon, and silicon bonded on sapphire.

Bonded wafer processes on silicon involve technologies to bond monocrystalline silicon materials onto semiconductor wafers and oxidation processes to form the semiconductor on insulator. In these technologies, a portion of one or both of the bonded wafers is removed, typically, by polishing methods. Another process to remove large portions of a bonded wafer uses a "Smart cut" technology. "Smart cut" technology generally refers to a process in which a material is implanted into a silicon substrate to a particular depth and ultimately utilized to crack the substrate.

There continues to be a need to provide fabrication processes and structures to reduce the overall cost for a silicon microchip integrated circuit.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. Both wafer and substrate can include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims, along with the full scope of equivalents to which such claims are entitled.

Figure 1:
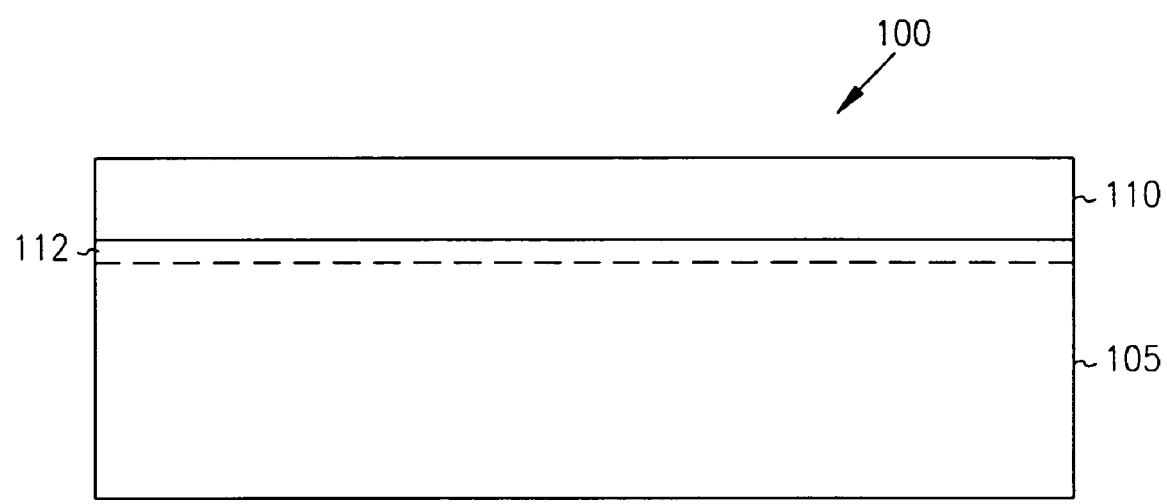
FIG. 1 illustrates an embodiment of a semiconductor on insulator, according to the present invention.

FIG. 1 illustrates an embodiment of a semiconductor on insulator structure 100. Semiconductor on insulator structure 100 includes a substrate 105, and a semiconductor layer 110 bonded to substrate 105. Semiconductor on insulator structure 100 is configured with semiconductor layer 110 of a different material than substrate 105, where the coefficient of thermal expansion of substrate 105 is substantially equal to that of semiconductor layer 110. In an embodiment, semiconductor layer 110 also has a thickness such that semiconductor layer 110 does not yield due to temperature-induced strain at device processing temperatures. Temperature-induced strain includes strain that is produced in a material combined with another material as a result of mismatches in the coefficients of thermal expansion of the two materials.

In an embodiment, substrate 105 has a material composition that includes a semiconductor that is within the semiconductor layer 110. In an embodiment, substrate 105 has a material composition that includes oxygen. In an embodiment, substrate 105 has a material composition that includes an element, where the concentration of the element is controlled such that the coefficient of thermal expansion of substrate 105 substantially matches the coefficient of thermal expansion of semiconductor layer 110. In an embodiment, substrate 105 has a material composition that includes carbon, where the carbon concentration is such that the coefficient of thermal expansion of substrate 105 substantially matches the coefficient of thermal expansion of semiconductor layer 110. In an embodiment, substrate 105 is a silicon oxycarbide substrate. In an embodiment, semiconductor layer 110 includes silicon.

In an embodiment, an insulator layer 112 is disposed between semiconductor layer 110 and substrate 105. Insulator layer 112 can be an oxide of a semiconductor material contained in semiconductor layer 110. In an embodiment, semiconductor layer 110 is a silicon layer. In an embodiment where semiconductor layer 110 is a silicon layer having insulator layer 112, insulator layer 112 is a silicon oxide, which can include a native silicon oxide. However, insulator layer 112 is not limited to an oxide and can include other insulator materials. Insulator layer 112 provides further reduction of stray capacitances and/or be used in processing device circuitry in the semiconductor on insulator structure. Additionally, semiconductor layer 110 can include and is not limited to a semiconductor layer containing germanium, gallium arsenide, a silicon-germanium compound, and other semiconductor materials as are known to those skilled in the art.

An embodiment of a method for forming a semiconductor on insulator structure includes providing a substrate and forming a semiconductor layer on the substrate, where the substrate is a material different than the semiconductor. The substrate has a coefficient of thermal expansion that is substantially equal to the coefficient of thermal expansion of the semiconductor layer. In an embodiment, the substrate is a compound of several elements and is formed by controlling the concentration of an element of the compound to provide the resulting substrate with a coefficient of thermal expansion substantially matched to that of a semiconductor to be formed on the substrate. In an embodiment, a silicon layer is bonded to a silicon oxycarbide substrate having a coefficient of thermal expansion substantially equal to that of the silicon layer. In an embodiment, a silicon layer bonded to a substrate provides a silicon on insulator structure in which circuitry for electronic devices is configured.

The use of substrates with coefficients of thermal expansion matched to the semiconductor layer formed on the substrate to provide a semiconductor on insulator structure, such as a silicon layer on or above a silicon oxycarbide glass substrate, provides economic benefits. These substrates serve to reduce the energy consumption and costs of fabricating a microchip that are typically associated with producing high quality crystalline substrates in which the majority of the substrate is not used in any device function and serves only as a carrier substrate. The use of high quality, high cost crystalline substrates as such a carrier substrate is typically not an efficient use of resources.

Figure 2:
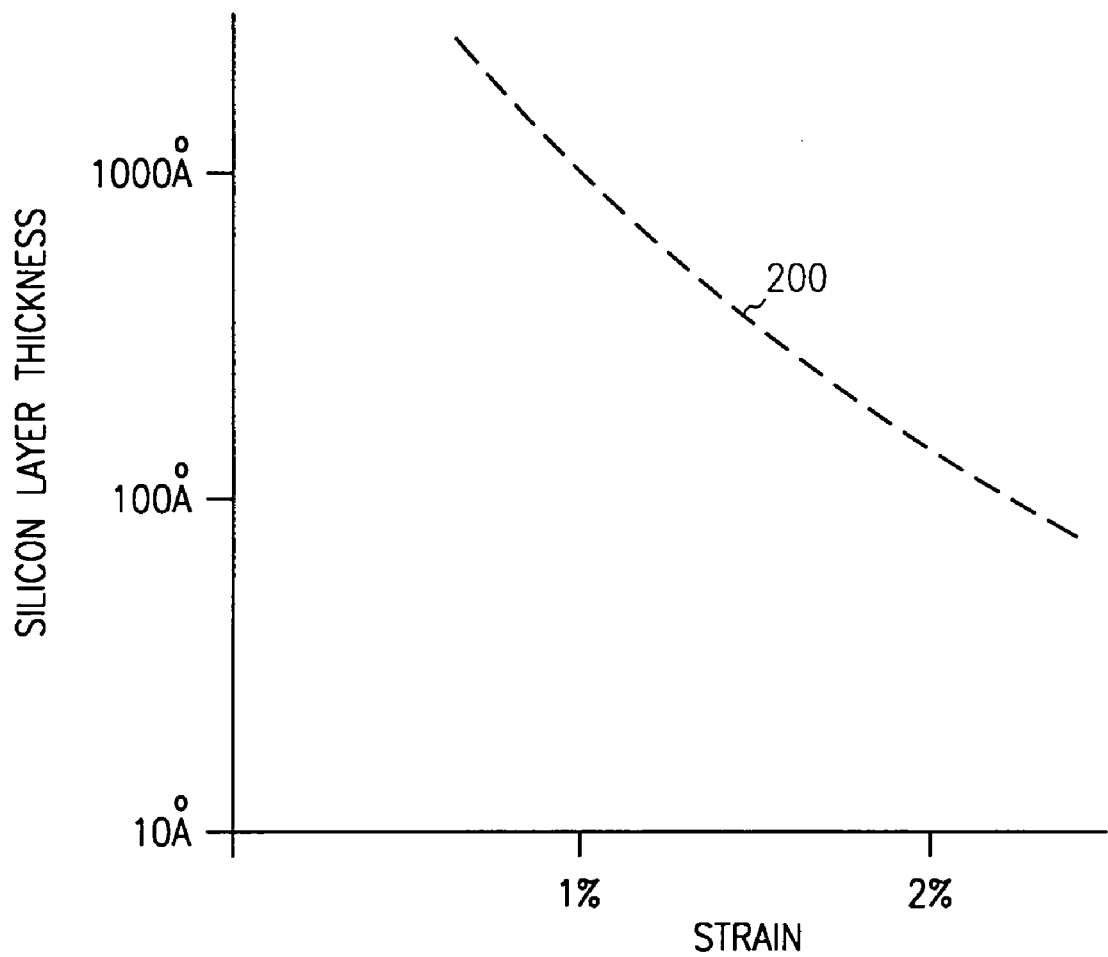
FIG. 2 illustrates a relationship between silicon layer thickness and strain.

In addition to efficient use of resources, there are fabrication issues associated with processing devices in a wafer at elevated temperatures. For instance, a silicon on insulator structure, where the silicon is bonded to a substrate, is subject to problems during device formation using varying temperature processes. One of the problems associated with temperature processing in a bonded wafer technology involves the difference in coefficients of thermal expansion between the bonded materials. For example, the coefficients of thermal expansion for some commonly used materials includes silicon carbide with a coefficient of thermal expansion of 4.0 to $3.9 \times 10^{-6}$ cm/(cm K), silicon oxide with a coefficient of thermal expansion of $0.5 \times 10^{-6}$ cm/(cm K), and silicon with a coefficient of thermal expansion of $2.6 \times 10^{-6}$ cm/(cm K). Associated with these differences in the coefficients of thermal expansion is the creation of excessive stress when bonding thick layers when there is a mismatch in the coefficients of thermal expansion. The development of excessive stress can result in exceeding the strain limit of the materials. FIG. 2 provides an example of the limits on strain versus silicon layer thickness, where the dashed line 200 delineates the onset for yield, plastic deformation and defects in bulk silicon samples. If the strain is too large the materials will plastically deform by the introduction of dislocations, fracture and yield, or undergo excessive wafer bowing and/or warping. An approach to reduce stress includes bonding silicon onto compliant substrates using low viscosity borophosphorosilicate glass films, which flows to reduce the stress.

In an embodiment according to the present invention, a semiconductor on insulator structure includes a semiconductor layer formed on or above an insulating substrate of a different material than the semiconductor layer, where the coefficients of thermal expansion of the semiconductor layer and the substrate are substantially equal. In an embodiment, a semiconductor on insulator includes a thin semiconductor layer bonded to a substrate, where the thin semiconductor layer also has a thickness such that the semiconductor layer does not yield due to temperature-induced strain at device processing temperatures. In an embodiment, the thin semiconductor layer is an ultra-thin silicon layer having a thickness ranging from about 0.1 microns to about 10 microns. An ultra-thin silicon layer of about 0.1 microns can tolerate the strain introduced by thermal cycling and the differences in thermal expansion coefficients. A 1000° C. temperature difference will only produce a strain of about 0.21%, which, as shown in FIG. 2, is not sufficient to cause the thin silicon layer to yield.

Insulating substrates in various embodiments may include glass substrates. Glass substrates, such as silicon oxycarbide glass substrates, can be provided in the form of wafers at costs significantly less than the costs associated with providing high quality, crystalline semiconductor wafers. Thus, application of these materials in semiconductor device processing can reduce the overall cost to manufacture the device.

In embodiments, devices using the semiconductor on insulator structure of the present invention include circuitry in a semiconductor layer. In an embodiment, the circuitry is configured in a silicon layer bonded to a substrate. The silicon layer is monocrystalline allowing circuitry in the silicon layer, such as transistors, to have the performance level associated with devices having structures using single crystalline form. Having devices using single crystalline structures avoids the problems associated with grain boundaries of polycrystalline devices such as thin film polycrystalline transistors.

Figure 3:
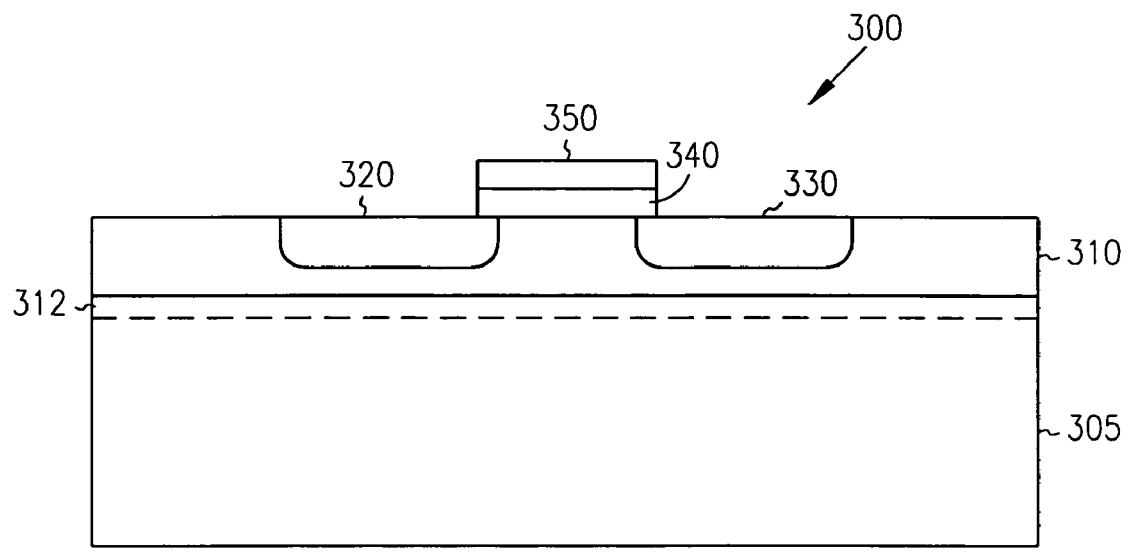
FIG. 3 depicts an embodiment of an electronic device using a semiconductor on insulator structure, according to the present invention.

FIG. 3 depicts an embodiment of an electronic device 300 using a semiconductor on insulator structure. Electronic device 300 includes an insulating substrate 305, a thin semiconductor layer 310 bonded to insulating substrate 305, and circuitry in thin semiconductor layer 310, where semiconductor layer 310 has a material composition different than insulating substrate 305 and has a coefficient of thermal expansion substantially equal to that of insulating substrate 305. In an embodiment, semiconductor layer 310 also has a thickness such that the semiconductor layer does not yield due to temperature-induced strain at device processing temperatures. FIG. 3 also depicts a transistor having a source 320, a drain 330, a gate dielectric 340 disposed on substrate 310 covering the substrate region between source 320 and drain 330, and a gate 350 disposed on gate dielectric 340, where the transistor is an example of the circuitry for an electronic device 300 using a semiconductor on insulator structure. An embodiment of an electronic device using a semiconductor on insulator as described herein is not limited to a transistor, but includes electronic devices using such a semiconductor on insulator structure. In an embodiment, the circuitry of electronic device 300 includes a memory circuit.

In an embodiment for electronic device, in addition to insulating substrate 305, electronic device 300 can include an insulating layer 312 between thin semiconductor layer 310 and insulating substrate 305. Insulator layer 312 can be a oxide of a semiconductor material contained in semiconductor layer 310. In an embodiment, semiconductor layer 310 is a silicon layer. In an embodiment, semiconductor layer 310 is a silicon layer having an insulating layer 312, where insulator layer 312 is a silicon oxide, which can include a native silicon oxide. However, insulator layer 312 is not limited to an oxide and can include other insulator materials. Additionally, semiconductor layer 310 can include and is not limited to a semiconductor layer containing silicon, germanium, gallium arsenide, a silicon-germanium compound, and other semiconductor materials as are known to those skilled in the art.

Various embodiments of electronic device 300 include fully depleted devices using CMOS device technology, and various embodiments include partially depleted devices. Devices using a partially depleted CMOS process can be configured with or without floating bodies. The structure, formation, and operation of CMOS devices are understood by those skilled in the art.

Figure 4:
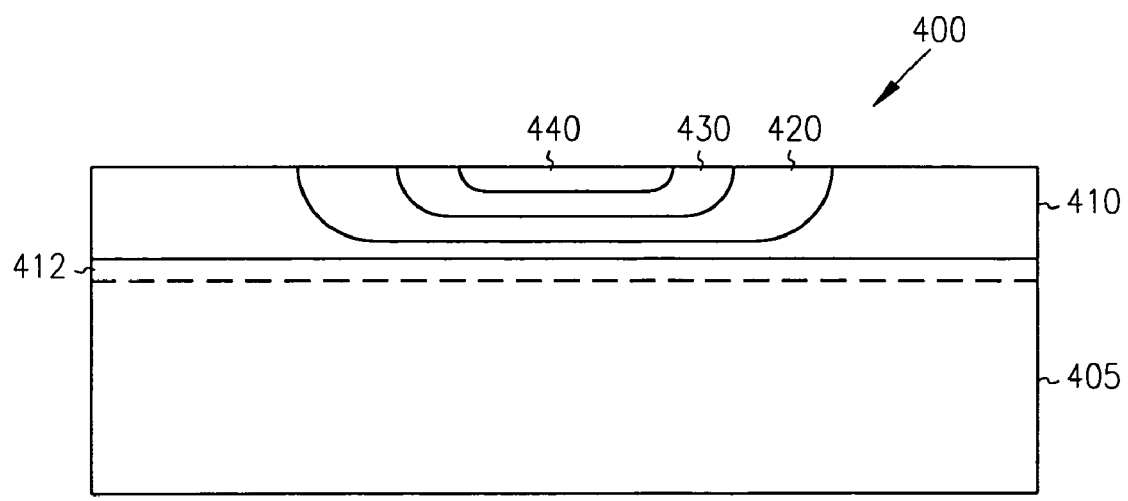
FIG. 4 depicts an embodiment of another electronic device using a semiconductor on insulator structure, according to the present invention.

FIG. 4 depicts an embodiment of an electronic device 400 using a semiconductor on insulator structure. Electronic device 400 includes an insulating substrate 405, a thin semiconductor layer 410 bonded to insulating substrate 405, and circuitry in thin semiconductor layer 410, where semiconductor layer 410 has a material composition different than insulating substrate 405 and has a coefficient of thermal expansion substantially equal to that of insulating substrate 405. In an embodiment, semiconductor layer 410 also has a thickness such that the semiconductor layer 410 does not yield due to temperature-induced strain at device processing temperatures. FIG. 4 also depicts a bipolar transistor having a collector 420, a base 430, and an emitter 440 disposed in semiconductor layer 410, where the bipolar transistor is another example of the circuitry for an electronic device 400 using a semiconductor on insulator structure. An embodiment of an electronic device using a semiconductor on insulator as described herein is not limited to a bipolar transistor, but includes electronic devices using such a semiconductor on insulator structure. In an embodiment, electronic device 400 includes circuitry for an integrated circuit.

In an embodiment for electronic device, in addition to insulating substrate 405, electronic device 400 can include an insulating layer 412 between thin semiconductor layer 410 and insulating substrate 405. Insulator layer 412 can be a oxide of a semiconductor material contained in semiconductor layer 410. In an embodiment, semiconductor layer 410 is a silicon layer. In an embodiment, semiconductor layer 410 is a silicon layer having an insulating layer 412, where insulator layer 412 is a silicon oxide, which can include a native silicon oxide. However, insulator layer 412 is not limited to an oxide and can include other insulator materials. Additionally, semiconductor layer 410 can include and is not limited to a semiconductor layer containing silicon, germanium, gallium arsenide, a silicon-germanium compound, and other semiconductor materials as are known to those skilled in the art.

Embodiments for electronic devices using semiconductor on insulator structures as described herein have an isolated device area realized on an insulating substrate. Stray capacitances are minimized because the device drain, source, and/or collectors are on an insulating substrate. Interconnection wire is configured over an isolation oxide and the insulating substrate to minimize wiring capacitance. Reducing these parasitic capacitances reduces power consumption during circuit operation and increases the speed of operation.

Figure 5:
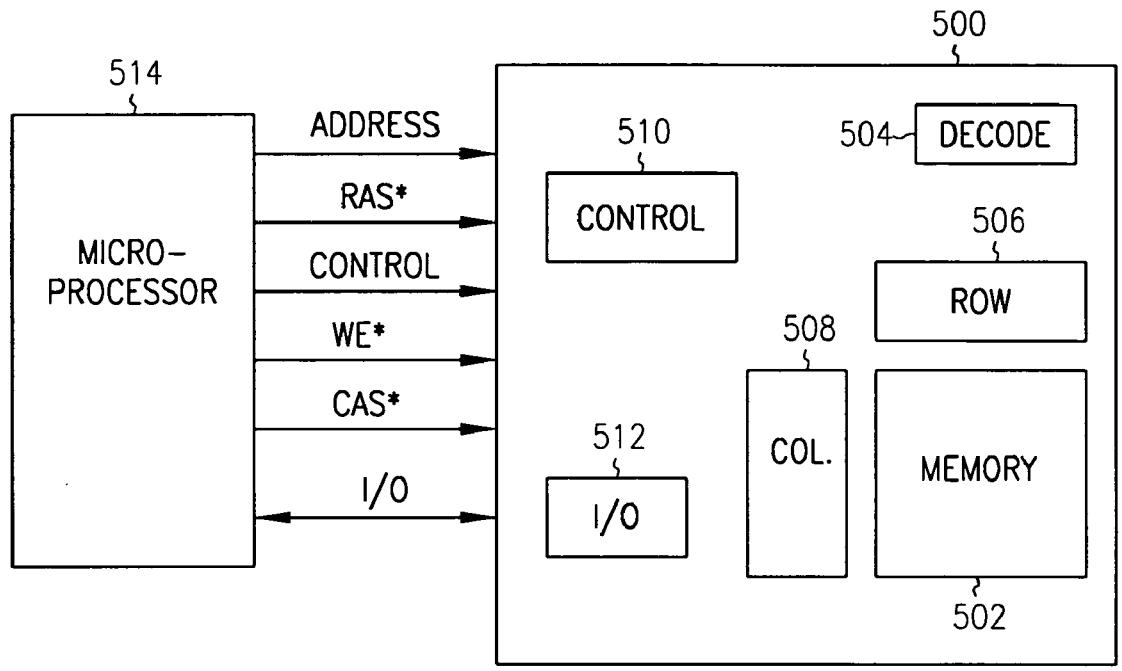
FIG. 5 is a simplified block diagram of a memory device using an embodiment of a semiconductor on insulator structure, according to the present invention.

FIG. 5 is a simplified block diagram of a memory device 500 using an embodiment of a semiconductor on insulator structure. Memory device 500 includes an array of memory cells 502, address decoder 504, row access circuitry 506, column access circuitry 508, control circuitry 510, and input/output (I/O) circuit 512. The memory is operably coupled to an external microprocessor 514, or memory controller for memory accessing. Memory device 500 receives control signals from processor 514, such as WE*, RAS* and CAS* signals, which can be supplied on a system bus. Memory device 500 stores data that is accessed via I/O lines. It will be appreciated by those skilled in the art that additional circuitry and control signals can be provided, and that the memory device of FIG. 5 has been simplified to help focus on the present invention. At least one of the integrated circuit structures is formed in a silicon layer that is part of a semiconductor on insulator structure, such as a silicon on silicon oxycarbide glass structure, according to an embodiment.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 6:
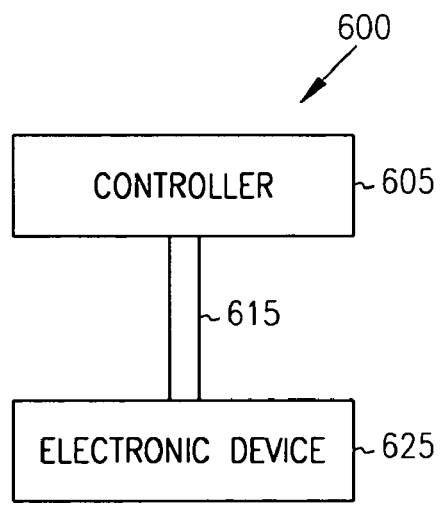
FIG. 6 illustrates a block diagram for an electronic system having devices that use an embodiment of a semiconductor on insulator structure, according to the present invention.

FIG. 6 illustrates a block diagram for an electronic system 600 having devices using an embodiment for a semiconductor on insulator structure. Electronic system 600 includes a controller 605, a bus 615, and an electronic device 625, where bus 615 provides electrical conductivity between controller 605 and electronic device 625. In various embodiments, controller 605 and/or electronic device 625 includes an embodiment for a semiconductor on insulator structure as previously discussed having a substrate and a semiconductor layer bonded to the substrate. The substrate of a different material than the semiconductor layer has a coefficient of thermal expansion substantially equal to that of the semiconductor layer. In an embodiment, the semiconductor layer also has a thickness such that the semiconductor layer does not yield due to temperature-induced strain at device processing temperatures. In an embodiment, electronic system 600 includes a plurality of electronic devices using an embodiment for a semiconductor on insulator structure. Electronic system 600 may include, but is not limited to, information handling systems, wireless systems, telecommunication systems, fiber optic systems, electro-optic systems, and computers.

Figure 7:
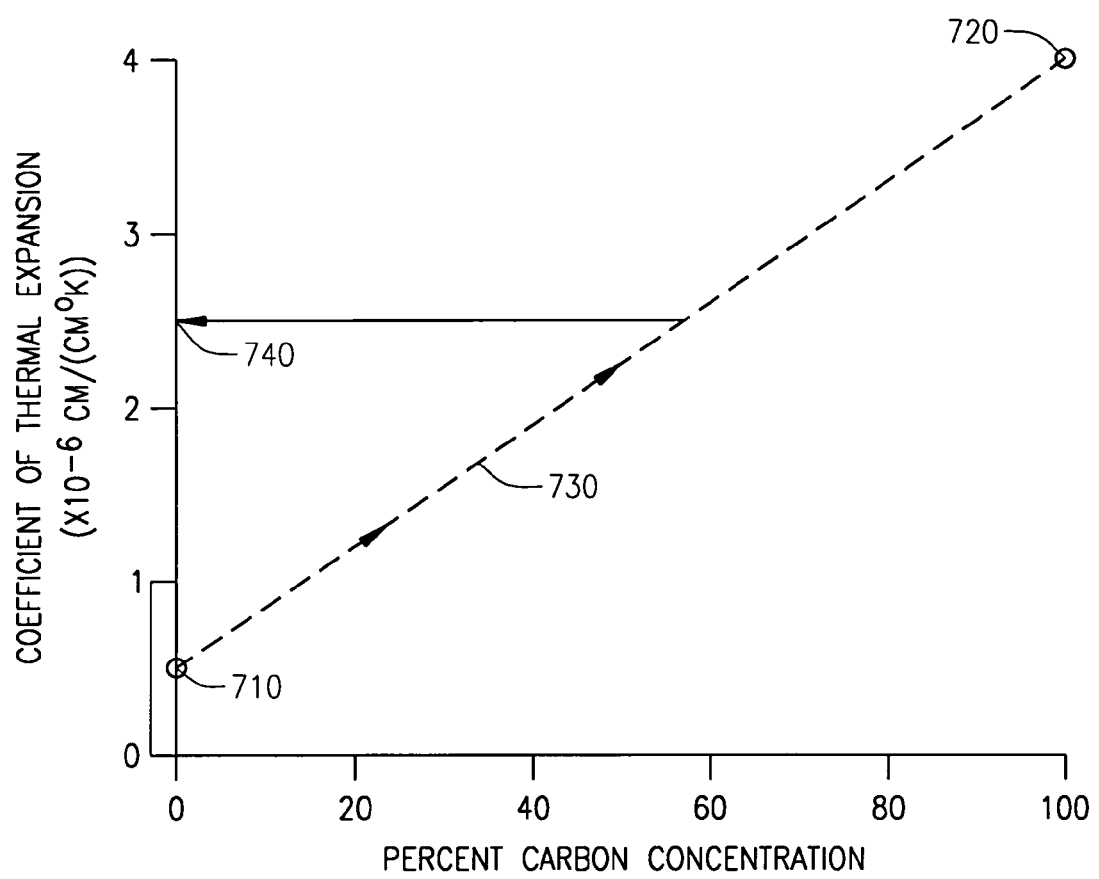
FIG. 7 illustrates an embodiment for matching a substrate with a semiconductor layer, according to the present invention.

FIG. 7 illustrates an embodiment for matching a substrate with a semiconductor layer, according to the present invention. In particular, FIG. 7 illustrates matching a silicon oxycarbide substrate with a silicon layer by selecting the carbon content of the silicon oxycarbide substrate.

According to an embodiment of the present invention, for a given semiconductor layer, a multiple element material is selected for the substrate on which to form the given semiconductor layer to provide a semiconductor on insulator structure. An element of the multiple element material can be varied in concentration to engineer a substrate with a selected, or predetermined, coefficient of thermal expansion. The controlled element acts as a matching element such that the selected, or predetermined, coefficient of thermal expansion is chosen to match the coefficient of thermal expansion of the given semiconductor layer to be formed on the substrate.

A matching element in a multiple element material can be varied by replacing another element in a multiple element material ranging from little or no concentration of the matching element shown at 710 in FIG. 7 to total replacement of an element at 720 along line 730, as illustrated in FIG. 7. The percent concentration of the matching element is chosen such that the coefficient of thermal expansion matches that of the given semiconductor layer at 740. In an embodiment, oxygen is the element of a multiple element material that is replaced at an amount depending on the material of the semiconductor layer to be matched. In an embodiment, carbon is the matching element.

In an embodiment, silicon oxycarbide is the multiple element material used for a substrate with carbon acting as the replacing element. With no carbon in the multiple element material, it is a silicon oxide material at 710 in FIG. 7, while with a 100% replacement of the oxygen with carbon, the multiple element material is silicon carbide at 720 in FIG. 7. For matching purposes, in an embodiment with silicon as the semiconductor layer, the coefficient of thermal expansion for silicon oxide is significantly lower than that of silicon, while the coefficient of thermal expansion for silicon carbide is significantly higher than that of silicon. However, silicon oxycarbide glasses have a coefficient of thermal expansion larger than that of vitreous silica or silicon oxide. By forming a silicon oxycarbide substrate in which carbon has replaced oxygen, the coefficient of thermal expansion of the silicon oxycarbide substrate can substantially match that of the silicon semiconductor layer. The matching of the coefficient of thermal expansion for silicon oxycarbide with that of silicon can be realized with a carbon concentration of approximately 60% to 70%, replacing oxygen. Other materials for the semiconductor layer and other multiple element materials for the substrate can be used in various embodiments in accordance with the teachings of the present invention.

In an embodiment, silicon oxycarbide glasses can be fabricated that are stable amorphous glass plates up to temperatures of 1200° C. Thin silicon oxycarbide glass sheets are synthesized by the pyrolysis of gel sheets obtained from a methyl-modified silica sol containing colloidal silica under an inert atmosphere at temperatures ranging from 900 to 1200° C. The silicon oxycarbide glass substrate sheets are polished and cut into wafer size patterns to act as substrate wafers. After patterning they can be further chemically and mechanically polished.

Figure 8:
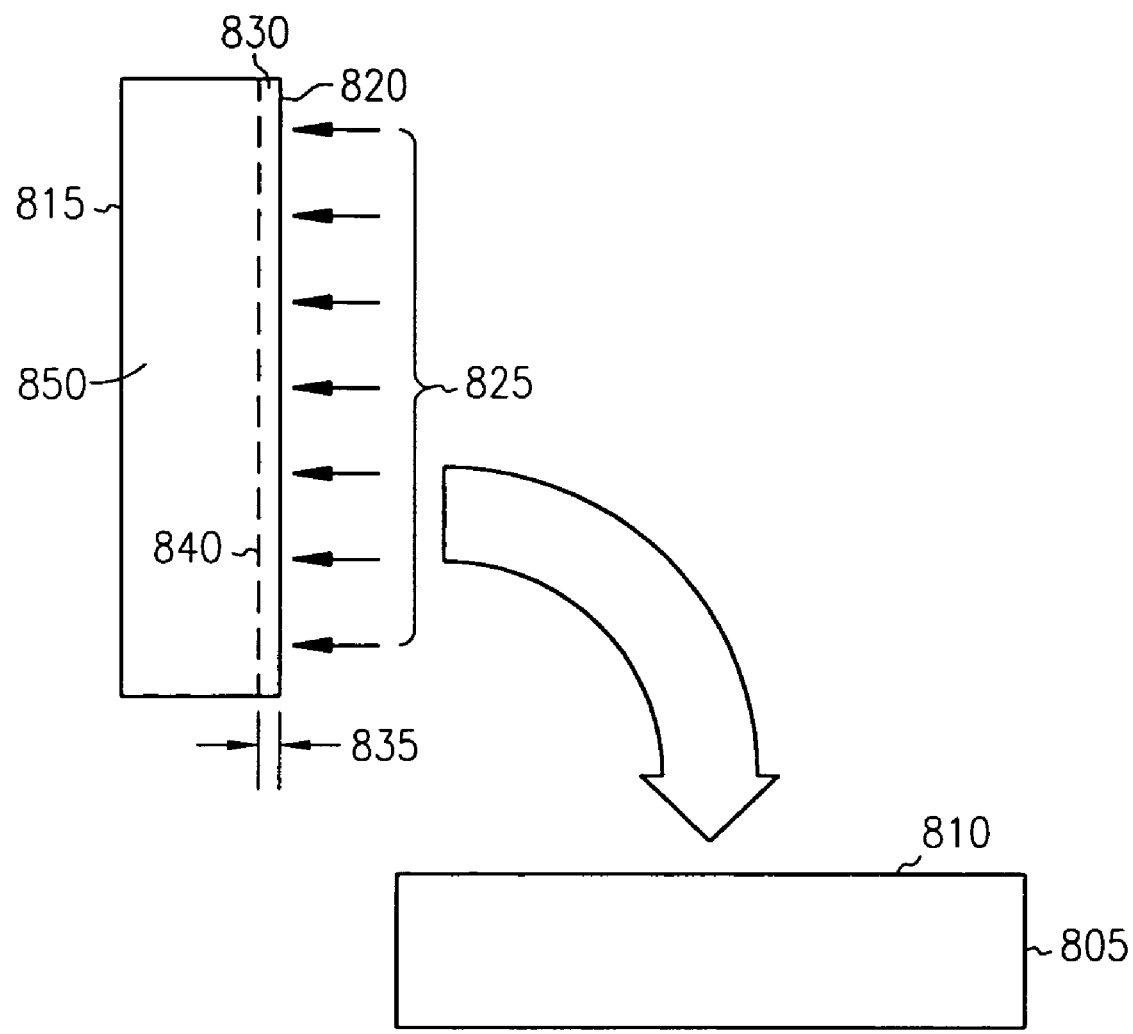
FIG. 8 illustrates the relationship of elements in an embodiment for a method to form a semiconductor on insulator structure, according to the present invention.

FIG. 8 illustrates the relationship of elements in an embodiment for a method to form a semiconductor on insulator structure. An embodiment for a method to form a semiconductor on insulator structure includes providing a substrate and forming a semiconductor layer on or above the substrate, where the substrate is an insulating material that is a different material than the semiconductor layer and has a coefficient of thermal expansion that is approximately equal to the coefficient of thermal expansion for the semiconductor layer. In an embodiment, the substrate is provided with a material composition that includes a semiconductor element that is in the semiconductor layer. In an embodiment, the substrate is provided with a material composition that includes oxygen. In an embodiment, the substrate is provided with a material composition that includes carbon. In an embodiment, the substrate is provided with a material composition that includes a silicon oxycarbide substrate having its carbon concentration adjusted to substantially match the coefficient of thermal expansion of the silicon oxycarbide substrate with than of the semiconductor layer. In an embodiment, the semiconductor layer is also formed as a bonded semiconductor layer having a thickness such that the semiconductor layer does not yield due to temperature-induced strain at device processing temperatures.

An embodiment for a method to form a semiconductor on insulator structure includes providing an insulating substrate, providing a semiconductor wafer, and performing a bonding cut process on the semiconductor wafer and the substrate to provide a thin semiconductor layer bonded to the substrate. The coefficients of thermal expansion of the substrate and the semiconductor layer are substantially equal. In an embodiment, the semiconductor layer bonded to the substrate also has a thickness such that the semiconductor layer does not yield due to temperature-induced strain at device processing temperatures.

Herein, a bonding cut process refers to a process in which two substrates, or wafers, are bonded together and a section of at least one of the two wafers is cut or broken off after attaching the two wafers together. For each wafer for which a section is cut or broken off, the wafer is conditioned prior to the actual cut by implanting atoms to a predetermined distance into the wafer to be cut. The attached wafers are heated to cut the conditioned wafers and to bond further the remaining portions of the two wafers at the attachment plane. The section removed from a conditioned wafer is the section of the conditioned wafer from the end of the conditioned wafer, which is away from the attachment to the other wafer, to the plane along the conditioned wafer that is at the distance to which the implantation was made. The removed section includes a significant portion of the original wafer, with the smaller portion that was subjected to implantation remaining bonded to the other wafer.

In an embodiment, insulating substrate 805 provided for fabricating a semiconductor on insulator structure includes a substrate that has been processed to have a coefficient of thermal expansion substantially equal to that of the semiconductor selected to form the semiconductor on insulator structure. The substrate material can include silicon oxycarbide glass. In an embodiment, the substrate is generated from thin silicon oxycarbide glass sheets. These silicon oxycarbide glass sheets are polished and cut into wafer size patterns to act as substrates for integrated circuits. These wafer size silicon oxycarbide glass sheets for forming substrates are relatively inexpensive as compared with silicon substrates. After patterning the substrates, these substrates can be further chemically and mechanically polished.

Semiconductor wafer 815 is conditioned as part of the bonding cut process prior to bonding to substrate 805. Semiconductor wafer 815 can include wafers having semiconductor material that includes, but is not limited to, silicon, germanium, silicon-germanium, gallium arsenide, indium phosphide, and other semiconductor materials. For ease of discussion regarding embodiments according to the present invention, the remainder of this discussion focuses on an embodiment using a silicon wafer as semiconductor wafer 815 and insulating substrate 805 in which the coefficients of thermal expansion for silicon wafer 815 and substrate 805 are substantially equal. Insulating substrate 805 can be considered as a matching substrate to semiconductor layer 815.

Silicon wafer 815, such as a single crystal wafer, is conditioned by subjecting a surface 820 to implantation of ions 825 to form an intermediate silicon layer 830 having a thickness 835. The ions are implanted along a plane 840, represented in FIG. 8 as a line, which is approximately parallel to surface 820. In an embodiment, hydrogen ions are used as implantation ions 825. The hydrogen ions can take the form of $H^+$, $H_2^+$, $D^+$, or $D_2^+$ ions. The implanted ions act to form cavities along the cleavage plane 840. The cavities are joined through thermal processing. Once these cavities join, the wafer becomes cut or broken off along plane 840. In an embodiment, silicon wafer 815 is also conditioned by forming an oxide on surface 820. The oxide can include a native oxide. The ion implantation can be performed before or after the oxide formation.

After conditioning silicon wafer 815, silicon wafer 815 and substrate 805 can be cleaned using conventional cleaning procedures. In an embodiment, silicon wafer 815 is also conditioned by forming an oxide on surface 820 before applying a cleaning procedure. Then, surface 820 of silicon wafer 815, with or without an oxide layer formed thereon, is attached to a surface 810 of substrate 805. This attachment of silicon wafer 815 to substrate 805 is typically by Van der Walls forces. Then, silicon wafer 815 is further bonded to substrate 805 causing a section 850 of silicon wafer 815 to cut or break off along cleavage plane 840.

As a result of this bonding cut, intermediate silicon layer 830 is bonded to substrate 805. Intermediate silicon layer 830 is defined by the depth of ion implantation to line 840 and has a thin thickness 835. In an embodiment, thickness 835 is generated to a thickness such that intermediate silicon layer 830 does not yield due to temperature-induced strain at device processing temperatures allowing intermediate silicon layer 830 to be used as the thin semiconductor layer 110 as depicted in FIG. 1. In an embodiment, intermediate silicon layer 830 has a thickness ranging from about 0.1 microns to about 10 microns. As a result of the thin nature of intermediate silicon layer 830, section 850 is relatively thick and has the form of a silicon wafer. Section 850 can be used with another insulating substrate to form another silicon on insulator structure, during which fabrication another remaining section from the bond cut process becomes available to be used with yet another substrate. This reduces the overall cost for the manufacturing process of a wide variety of electronic devices.

In an embodiment, plasma enhanced bonding is used to bond intermediate silicon layer 830 to substrate 805 and cut or break off section 850. In an embodiment, the bonding cut process includes raising the temperature of silicon wafer 815 attached to substrate 805 to a temperature ranging from about 400° C. to about 600° C. to cut or break off section 850. Then, the resulting bond between intermediate silicon layer 830 and substrate 805 can be strengthened by raising the temperature to a range from about 800° C. to about 1000° C. or annealing by laser assisted annealing. Though bonding of the silicon wafer 815, with or without an oxide layer on surface 820, can be accomplished with anodic bonding, anodic bonding for a CMOS process introduces high alkali concentration, which is not appropriate for the CMOS process.

In an embodiment, polishing intermediate silicon layer 830 that is bonded to substrate 805, with or without an insulating layer between silicon layer 830 and substrate 805, thins intermediate silicon layer 830. This subsequent polishing processes provides a thin silicon layer for the silicon on insulator structure. In an embodiment, intermediate silicon layer 830 is polished to provide an ultra-thin silicon layer having a thickness of about 0.1 microns. In an embodiment, intermediate silicon layer 830 is polished to provide a silicon layer having a thickness ranging from about 0.1 microns to about 10 microns.

Once the bond cut process is concluded providing a silicon layer bonded to a substrate, a silicon on insulator structure is ready for device processing. In the various embodiments discussed above, an silicon oxycarbide substrate can be used as the matching substrate for the silicon layer. Further, removed section 850 can be used to fabricate other silicon on insulator wafers. As previously discussed, embodiments include other semiconductor materials in place of the silicon to provide a semiconductor layer on a substrate of a different material composition, where the coefficient of thermal expansion of the substrate matches that of the semiconductor layer. In an embodiment, the semiconductor layer is also formed having a thickness such that the semiconductor layer does not yield due to temperature-induced strain at device processing temperatures. Thermal processing for the bond cut is performed by temperatures appropriate for the semiconductor wafer and matching substrate used.

Once the semiconductor on insulator wafer has been formed, device processing can be accomplished using conventional processes and procedures. For example, silicon on insulator substrates formed according to embodiments of the present invention can be further processed in a manner similar to silicon-on-sapphire wafers. In an embodiment, fully depleted CMOS devices can be fabricated by masking device areas with oxide and nitride and oxidizing the silicon in between device mesas, followed by conventional device fabrication techniques.

In an embodiment for forming an electronic device using a silicon on insulator structure according to the present invention, partially depleted CMOS devices can be formed with or without floating bodies. A layer of silicon thicker than for a fully depleted CMOS process is used and the thicker silicon layer is patterned by a trench isolation process similar to a SIMOX process. After patterning the silicon layer by the trench isolation, conventional techniques are used to process the device.

In an embodiment for forming an electronic device using a silicon on insulator structure, heavily doped collector patterns are formed in the silicon wafer prior to performing the bonding cut process to bond the silicon to the matching substrate. The silicon layer bonded to the matching surface is relatively thick. After the bonding of the silicon layer and formation of isolation regions, patterned base and emitter implantations are formed in the surface of the silicon layer. Further device processing is performed using conventional techniques.

In embodiments using a semiconductor on insulator structure as described herein, an isolated silicon device area is realized on an insulating substrate. Stray capacitances are minimized because the device drain, source, and/or collectors are on an insulating substrate. Interconnection wire is configured over an isolation oxide and the insulating substrate to minimize wiring capacitance. Reducing these parasitic capacitances reduces power consumption during circuit operation and increases the speed of operation.

In an embodiment, a method including the procedures and processes for forming a semiconductor on insulator structure and for forming devices and systems with elements using a semiconductor on insulator structure are controlled by a computer. The instructions for the method are stored in a computer readable format on a computer readable media. Examples of such computer readable media include but are not limited to laser readable disks, magnetic disks and tape, and computer memory.

CONCLUSION

Use of silicon substrates as a carrier substrate in which the majority of the silicon substrate is not used in any device function is not an efficient use of resources. Embodiments of the present invention include the use of substrates that serve to reduce the energy consumption and costs of fabricating a microchip that are typically associated with producing high quality crystalline substrates. Forming a semiconductor layer on or above a substrate, such as a silicon layer on or above a silicon oxycarbide glass substrate, in which the coefficient of thermal expansion of the substrate is matched to that of the semiconductor layer, has several attributes. By bonding a semiconductor layer to such a matched substrate, problems associated with differences in the coefficient of thermal expansion can be avoided. These problems can further be avoided by forming the semiconductor layer with a thickness such that the semiconductor layer does not yield due to temperature-induced strain at device processing temperatures. The cost associated with providing such matched substrates is significantly less than the cost for providing high quality semiconductor wafers such as silicon wafers. Performing a bond cut process as described herein allows a thin semiconductor layer to be taken from a high quality semiconductor wafer, such as a silicon wafer, to form a semiconductor on insulator wafer and at the same time provide for use of the same high quality semiconductor wafer to form multiple semiconductor on insulator structures. Further, such semiconductor on insulator wafers formed according to the various embodiments provide an isolated device area on an insulating substrate where stray device capacitances and wiring capacitances are minimized. Reducing these parasitic capacitances reduces power consumption during circuit operation and increases the speed of operation.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. A semiconductor on insulator structure comprising:
   an insulating substrate, the insulating substrate being a silicon oxycarbide substrate; and
   a semiconductor layer bonded to the insulating substrate, the insulating substrate being a different material than the semiconductor layer, wherein the insulating substrate has a coefficient of thermal expansion that is approximately equal to a coefficient of thermal expansion for the semiconductor layer, the semiconductor layer bonded to the insulating substrate being in a wafer configuration such that the semiconductor layer is arranged to provide a layer in which to form an integrated circuit.

2. The semiconductor on insulator structure of claim 1, wherein the semiconductor layer has a thickness such that the thickness is less than or equal to a maximum thickness at which the semiconductor layer does not yield due to temperature-induced strain at device processing temperatures relative to an insulating substrate that has a coefficient of thermal expansion that is different from the coefficient of thermal expansion for the semiconductor layer.

3. The semiconductor on insulator structure of claim 1, wherein the semiconductor layer has a thickness between 0.1 µm and 10.0 µm.

4. The semiconductor on insulator structure of claim 1, wherein the semiconductor on insulator structure includes an insulating layer between the semiconductor layer and the insulating substrate.

5. The semiconductor on insulator structure of claim 1, wherein the semiconductor layer is a silicon-based layer.

6. The semiconductor on insulator structure of claim 1, wherein the semiconductor on insulator structure includes an oxide layer between the semiconductor layer and the insulating substrate.

7. The semiconductor on insulator structure of claim 1, wherein the semiconductor layer has a thickness of about 0.1 µm.

8. The semiconductor on insulator structure of claim 1, wherein the semiconductor on insulator structure is substantially without an alkali concentration.

9. An electronic device comprising:
   an insulating substrate, the insulating substrate being a silicon oxycarbide substrate;
   a semiconductor layer bonded to the insulating substrate, the insulating substrate being a different material than the semiconductor layer, wherein the insulating substrate has a coefficient of thermal expansion that is approximately equal to a coefficient of thermal expansion for the semiconductor layer; and
   circuitry in the semiconductor layer.

10. The electronic device of claim 9, wherein the semiconductor layer has a thickness such that the thickness is less than or equal to a maximum thickness at which the semiconductor layer does not yield due to temperature-induced strain at device processing temperatures relative to an insulating substrate that has a coefficient of thermal expansion that is different from the coefficient of thermal expansion for the semiconductor layer.

11. The electronic device of claim 9, wherein the semiconductor on insulator structure is substantially without an alkali concentration.

12. The electronic device of claim 9, wherein the semiconductor layer is a silicon layer having a thickness ranging from about 0.1 microns to about 10 microns.

13. The electronic device of claim 9, wherein the semiconductor layer has a thickness ranging from about 0.1 microns to about 10 microns.

14. The electronic device of claim 9, wherein the electronic device includes an insulator layer between the semiconductor layer and the insulating substrate.

15. The electronic device of claim 9, wherein the electronic device includes an oxide layer between the semiconductor layer and the insulating substrate.

16. The electronic device of claim 9, wherein the circuitry includes circuitry of a memory device.

17. The electronic device of claim 9, wherein the circuitry includes a transistor.

18. The electronic device of claim 17, wherein the transistor includes a CMOS device.

19. The electronic device of claim 9, wherein the circuitry includes a bipolar transistor.

20. An electronic device comprising:
a silicon oxycarbide substrate;
a silicon layer bonded to the silicon oxycarbide substrate, wherein the silicon oxycarbide substrate has a coefficient of thermal expansion that is approximately equal to a coefficient of thermal expansion for the silicon layer; and
circuitry in the silicon layer.

21. The electronic device of claim 20, wherein the silicon layer has a thickness ranging from about 0.1 microns to about 10 microns.

22. The electronic device of claim 20, wherein the electronic device includes an oxide layer between the silicon layer and the silicon oxycarbide substrate.

23. The electronic device of claim 20, wherein the circuitry includes circuitry of a memory device.

24. The electronic device of claim 20, wherein the circuitry includes a transistor.

25. The electronic device of claim 20, wherein the circuitry includes a bipolar transistor.

26. An electronic system comprising:
a controller;
a bus; and
an electronic device coupled to the processor by the bus, the electronic device including:
an insulating substrate, the insulating substrate being a silicon oxycarbide substrate;
a semiconductor layer bonded to the insulating substrate, the insulating substrate being a different material than the semiconductor layer, wherein the insulating substrate has a coefficient of thermal expansion that is approximately equal to a coefficient of thermal expansion for the semiconductor layer; and
circuitry in the semiconductor layer.

27. The electronic system of claim 26, wherein the semiconductor layer has a thickness such that the thickness is less than or equal to a maximum thickness at which the semiconductor layer does not yield due to temperature-induced strain at device processing temperatures relative to an insulating substrate that has a coefficient of thermal expansion that is different from the coefficient of thermal expansion for the semiconductor layer.

28. The electronic system of claim 26, wherein the semiconductor on insulator structure is substantially without an alkali concentration.

29. The electronic system of claim 26, wherein the semiconductor layer is a silicon layer having a thickness ranging from about 0.1 microns to about 10 microns.

30. The electronic system of claim 26, wherein the semiconductor layer has a thickness ranging from about 0.1 microns to about 10 microns.

31. The electronic system of claim 26, wherein the circuitry includes a transistor.

32. The electronic system of claim 26, wherein the circuitry includes a bipolar transistor.

33. The electronic system of claim 26, wherein the circuitry includes circuitry of a memory device.

34. The electronic system of claim 26, wherein the electronic system includes an information handling system.

35. The electronic system of claim 26, wherein the electronic system includes a wireless system.

36. The electronic system of claim 26, wherein the electronic system includes an electro-optic system.

37. An electronic system comprising:
a processor;
a system bus; and
a memory device coupled to the processor by the system bus, the memory device including:
a silicon oxycarbide substrate;
a silicon layer bonded to the silicon oxycarbide substrate, wherein the silicon oxycarbide substrate has a coefficient of thermal expansion that is approximately equal to a coefficient of thermal expansion for the silicon layer; and
a circuit in the silicon layer.

38. The electronic system of claim 37, wherein the silicon layer has a thickness ranging from about 0.1 microns to about 10 microns.

39. The electronic system of claim 37, wherein the memory device includes an oxide layer between the silicon layer and the silicon oxycarbide substrate.

40. The electronic system of claim 37, wherein the electronic system includes an information handling system.

* * * * *

UNITED STATES PATENT AND TRADEMARK OFFICE
CERTIFICATE OF CORRECTION

PATENT NO. : 7,528,463 B2 Page 1 of 1
APPLICATION NO. : 11/214495
DATED : May 5, 2009
INVENTOR(S) : Leonard Forbes It is certified that error appears in the above-identified patent and that said Letters Patent is hereby corrected as shown below:

On the Title page, in field (73), in "Assignee", in column 1, line 1, delete "Technolgy," and insert -- Technology, --, therefor.

Signed and Sealed this

Twenty-first Day of July, 2009

JOHN DOLL
*Acting Director of the United States Patent and Trademark Office*